United States Patent [19]
Yoshida

[11] Patent Number: 5,262,226
[45] Date of Patent: Nov. 16, 1993

[54] ANISOTROPIC CONDUCTIVE FILM

[75] Inventor: Yoshihiro Yoshida, Atsugi, Japan

[73] Assignee: Ricoh Company, Ltd., Tokyo, Japan

[21] Appl. No.: 664,548

[22] Filed: Mar. 4, 1991

[30] Foreign Application Priority Data

| Mar. 16, 1990 | [JP] | Japan | 2-66340 |
| Mar. 16, 1990 | [JP] | Japan | 2-66341 |
| Jun. 15, 1990 | [JP] | Japan | 2-157187 |
| Aug. 17, 1990 | [JP] | Japan | 2-217934 |

[51] Int. Cl.$^5$ .............................................. B32B 9/00
[52] U.S. Cl. .................... 428/209; 428/472.2; 428/901; 174/88 R; 174/84 R
[58] Field of Search ............... 428/901, 472.2, 209; 174/88 R, 84 R

[56] References Cited

U.S. PATENT DOCUMENTS

| 3,646,572 | 2/1972 | Burr | 174/88 R |
| 4,249,302 | 2/1981 | Crepeau | 428/901 |
| 4,348,548 | 9/1982 | Grundfest | 174/88 R |
| 4,633,035 | 12/1986 | McMonagle | 428/901 |
| 5,035,197 | 7/1991 | Enoguchi et al. | 118/647 |
| 5,072,289 | 12/1991 | Sugimoto et al. | 357/68 |

Primary Examiner—Patrick J. Ryan
Assistant Examiner—Cathy K. Lee
Attorney, Agent, or Firm—Cooper & Dunham

[57] ABSTRACT

An anisotropic conductive film comprising: an electrically insulating film member having an upper surface and a lower surface; and a plurality of conductive members. Each conductive member is buried in the film member and protrudes from both of the upper surface and the lower surface.

21 Claims, 12 Drawing Sheets

ANISOTROPIC CONDUCTIVE FILM

BACKGROUND OF THE INVENTION

1. Field of the Invention

The present invention relates to an anisotropic conductive film and the method for producing the film which is used for mounting a semiconductor chip on a substrate or connecting the substrates. More particularly, the present invention relates to the anisotropic conductive film comprising an electrically insulation member made from a porous metal oxide film made by anodic oxidation wherein the ability of electric connection of the film is raised.

2. Description of the Related Art

These days, in the technical field of mounting semiconductor chips such as LSI on a printed wiring board, there has been a demand for connecting chips in high density and reliably. Therefore, it is required that the anisotropic conductive film which is used for mounting the chips on the substrate satisfy the demand at a low cost. The film comprises an electrically insulation film and a conductive portion which is buried in the insulation film and comes electrically in touch with the semiconductor chip mounted on the substrate or an electrode pattern formed on the substrate. The film assembly is electrically conductive only in the direction along the film thickness, that is, in the direction perpendicular to the film surface.

Such an anisotropic conductive film is made in such a way that an electrically insulation sheet having a predetermined thickness is formed from, for example, resin material and that conductive particles made of, for example, metal are dispersed in the sheet or arranged at a predetermined interval. The insulation sheet is made from a resin which becomes adhesive when heated.

However, according to the film produced in the way as mentioned above, when the chips to be connected are arranged in high density, the conductive particles are also to be arranged in high density, which sometimes results in the short circuit between the adjacent particles.

Also, in accordance with the film in which the conductive particles are dispersed in the insulation sheet, the characteristic of conductivity is uncontrollable since the characteristic is dependent on the distribution of the particles.

Also, in accordance with the film in which the conductive particles are arranged in a predetermined interval, the particles are moved when the film is heated and pressed at the time of connecting operation, which disturbs the pitch of particles, thus resulting in the decrease of connection reliability.

Besides, the functional reliability of the film is also degraded when the film is heated or by moisture absorption.

SUMMARY OF THE INVENTION

It is therefore an object of the present invention to provide an anisotropic conductive film and a method for producing the film, wherein the above mentioned problems can be obviated by arranging a high heat resistant electrically insulation member which has a plurality of pores almost penetrating through the film in the direction along the thickness, so that the conductive members can be arranged at a minute pitch without involving the short circuit and that the movement of the conductive particles when the film is heated and pressed can be avoided.

The above mentioned object of the present invention can be achieved by an anisotropic conductive film comprising:

an electrically insulating film member having an upper surface and a lower surface; and a plurality of conductive members each buried in the film member protruding from both of the upper surface and the lower surface.

That is, the anisotropic conductive film in accordance with the present invention comprises: a film-like insulation member made by oxidizing a conductive material by an anodic oxidation process; and a conductive member buried in the insulation member so as to make the insulation member conductive in the direction perpendicular to the film surface.

Also, in accordance with the present invention, an anodic oxidation film is formed from a conductive material by an anodic oxidation process, which film is stable in a high temperature and high humidity atmosphere. The anodic oxidation film is used as the film-like insulation member. The conductive member is buried in the anodic oxidation film.

An advantage of the present invention due to such an arrangement is that it becomes possible to reduce the connecting pitch of the film without involving the short circuit and prevent the conductive member from moving at the time of connecting operation, which raises the reliability of the electric connection.

Further, in accordance with the present invention, the film-like insulation member has a plurality of minute pores formed by anodic oxidation.

An advantage of the above mentioned arrangement is that the conductive members can be disposed very close to each other so that the connecting pitch is reduced without occurrence of short circuit.

Also, another advantage of the above mentioned arrangement is that a desired connecting pattern can be easily realized by selectively using the pores in which the conductive members are arranged or by forming protruding portions on the conductive member disposed over the entire surface of the film.

A further advantage of the above mentioned arrangement is that it becomes possible to reduce the cost for producing the film since the quantity of the conductive material can be reduced.

Further, in accordance with the present invention, the conductive member may be constituted from aluminium.

An advantage of this arrangement is that, by selectively conducting the anodic oxidation, it becomes possible to bury the conductive member of aluminium in the film-like insulation member made from alumina in a desired distribution pattern, which facilitates the production of the anisotropic conductive film.

In accordance with a method for producing the anisotropic conductive film of the present invention, the method includes a step of forming a film-like insulation member by anodic oxidation of a conductive material and a step burying a conductive member in the insulation member.

The conductive member may be formed by an electrolytic deposition process.

An advantage of the above mentioned arrangement of the present invention is that the conductive member can be easily buried in the minute pore of the anodic oxidation film.

Further, the method for producing the anisotropic conductive film in accordance with the present invention comprises: a step of forming an anodic oxidation film having a plurality of minute pores of a predetermined depth formed on an upper layer of a conductive substrate by an anodic oxidation process; a step of forming conductive members of metal in the pores of the anodic oxidation film by an electrolytic deposition process; a step of separating the anodic oxidation film from the conductive substrate; and a step of removing a surface layer of the anodic oxidation film to protrude the conductive member out of the anodic oxidation film.

An advantage of the above mentioned arrangement is that it becomes possible to easily form electrodes in the pores of the anodic oxidation film at the time of the electrolytic deposition process, since the anodic oxidation film is formed first in the upper layer portion of the conductive substrate and after that the film is removed from the substrate to form a film-like insulation member.

Also, it is desirable that, when the conductive members are to be formed in the pores of the anodic oxidation film, the pores are selectively masked or the electrodes are selectively formed so that the conductive members are selectively arranged. Due to such an arrangement, it becomes possible to selectively remove the anodic oxidation film and protrude the conductive members at desires positions.

It is to be noted that the conductive members can be arranged by burying a metal paste material or conductive macromolecule material in the pores. The conductive member can also be arranged by an electroless plating process or a dry plating process such as vacuum evaporation, sputtering or CVD.

Further objects and advantages of the present invention will be apparent from the following description of the preferred embodiments of the invention as illustrated in the accompanying drawings.

BRIEF DESCRIPTION OF THE DRAWINGS

FIG. 8b is an explanatory view of a state of mounting a semiconductor chip on a substrate with the use of the embodiment of FIG. 8a;

FIG. 8c is an explanatory view of a state of connecting printed wiring boards with each other with the use of the embodiment of FIG. 8a;

DESCRIPTION OF THE PREFERRED EMBODIMENTS

Embodiments of the present invention are described hereinafter with reference to the drawings.

Figure 1:
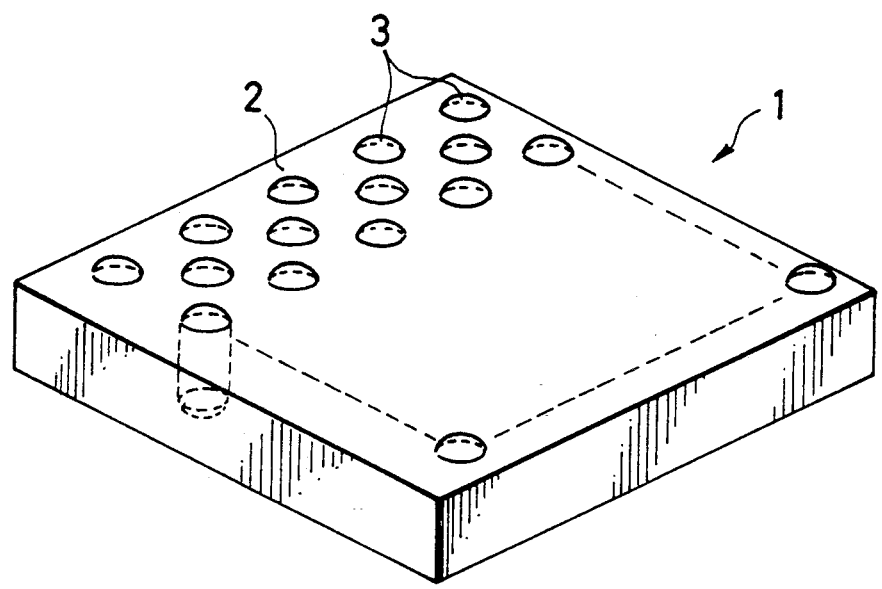
FIG. 1 is a perspective view of an embodiment of the anisotropic conductive film in accordance with the present invention.
Figure 2:
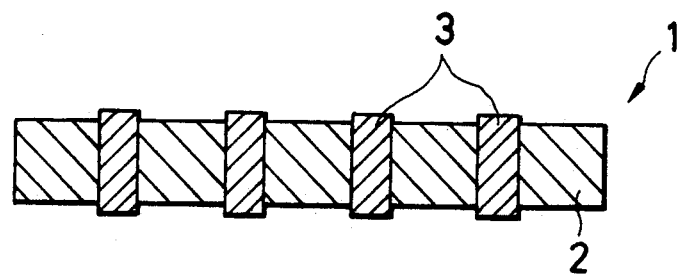
FIG. 2 is a sectional view of the embodiment of FIG. 1.

FIGS. 1 to 3 represent a first embodiment of the anisotropic conductive film and the method for producing the film in accordance with the present invention.

First, the structure of the anisotropic conductive film of the invention is explained with reference to FIGS. 1 and 2.

In FIGS. 1 and 2, numeral 1 designates an anisotropic conductive film as a whole. Numeral 2 designates a film-like electrically insulation member made from alumina ($Al_2O_3$) formed by anodic oxidation of aluminium. Numeral 3 designates a conductive member which is buried in the insulation member 2 and extending in the direction along the thickness of the film, that is, perpendicular to the film surface from the upper surface to the lower surface of the film. A plurality of conductive members 3 are arranged in the insulation member 2 at predetermined positions. The conductive member 3 is made from, for example, aluminium (Al). The member 3 protrudes from both of upper and lower surfaces of the member 2 so that the member 2 becomes conductive only in the direction of thickness of the film.

The film 1 is disposed between, for example, a semiconductor chip and a substrate on which the chip is to be mounted so that the member 3 comes in contact with the electrode pad of the chip and the electrode terminal of the substrate so that the chip and the substrate are electrically connected. Or otherwise, the film 1 is disposed between, for example, printed wiring boards to be connected together so that the member 3 comes in contact with the electrode terminals of the boards so that the two printed wiring boards are electrically connected.

Next, an example of the method for producing the above mentioned anistropic conductive film is described below with reference to FIGS. 3a to 3d.

Figure 3A:
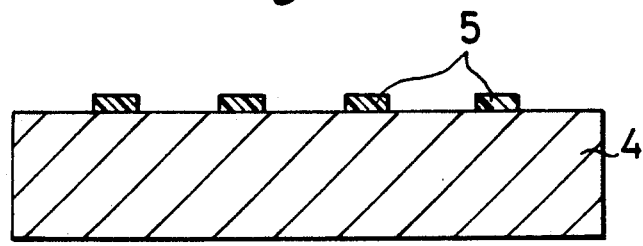
FIGS. 3a to 3d are sectional views of the anisotropic conductive film of FIG. 1 for explaining a flow of the process for producing the film and representing the film in different steps of the process in this order.

First, as illustrated in FIG. 3a, a photoresist pattern 5 is formed on an electrically conductive aluminium plate 4. The photoresist 5 is formed in such a way that an entire surface of the Al plate 4 is coated with a resist agent first and after that the resist is patterned to form a predetermined dot pattern wherein a plurality of dots of diameter 20 μm are arranged at a pitch of 50 μm.

Figure 3B:
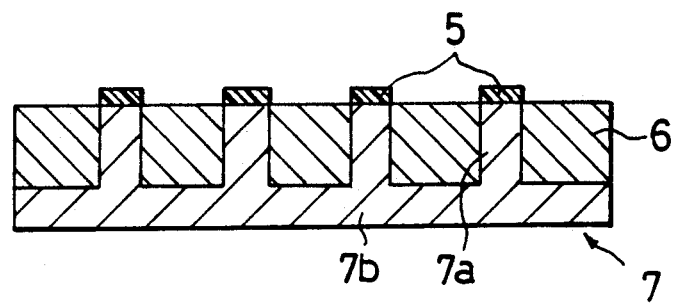

Subsequently, as illustrated in FIG. 3b, an anodic oxidation film (Al₂O₃) 6 is formed in the upper layer portion on an Al substrate 7. The film 6 is formed in such a way that the upper layer portion of the Al plate 4 (FIG. 3a) partly covered with the resist 5 is dipped in an acid solution such as phosphoric acid solution or sulfuric acid solution and that the plate 4 selectively undergoes an anodic oxidation process according to the pattern of the resist 5 with the plate 4 being arranged as an anode of the electrolysis process. The substrate 7 comprises a plurality of stud portions 7a and a plate portion 7b.

Figure 3C:
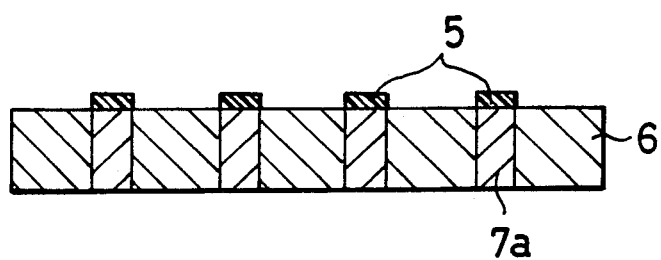

After that, as illustrated in FIG. 3c, the plate portion 7b is removed by grinding or dissolving the portion so that an anodic oxidation film 6 having a plurality of studs 7a buried therein is formed.

Figure 3D:
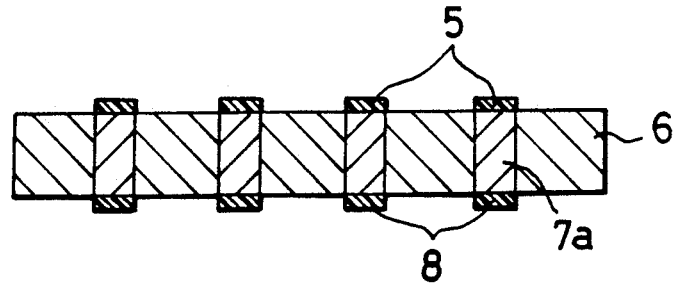

After that, as illustrated in FIG. 3d, the same photoresist pattern 8 as the upper photoresist pattern 5 is formed on the lower side of the film 6. The film 6 is then dipped in a hydrochloric acid solution or a phosphoric acid solution so that 1 to 20 μm of the upper and lower surfaces of the film 6 is dissolved to form the film-like insulation member 2 (FIGS. 1 and 2).

After that, the photoresists 5 and 8 are removed so that the anisotropic conductive film 1 of the present invention is obtained.

As mentioned above, in accordance with the present invention, it becomes possible to bury the conductive members 3 in the insulation member 2 according to a desired distribution pattern by the selective anodic oxidation process. Therefore, the film 1 can be applied to the chip connecting or mounting structure of high density wherein the chips are arranged at a pitch of, for example, 150 μm or less. Also, it becomes possible to certainly avoid short circuit between the members 3.

Also, since the member 2 is made from the anodic oxidation film (Al₂O₃) of aluminium, the film becomes much more humidity-resistant and heat-resistant in comparison to the film of prior art. Therefore, it becomes possible to use a wide variety of connection methods such as a supersonic method, a soldering method, and an adhesive agent method using a thermosetting material or an ultraviolet-setting material, which makes it possible to shorten the time of connecting operation and widen the applicability of the film.

Figure 4:
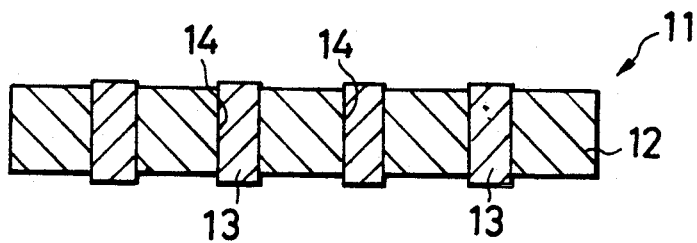
FIG. 4 is a sectional view of another embodiment of the anisotropic conductive film in accordance with the present invention.

FIGS. 4 and 5 represent a second embodiment of the anisotropic conductive film and the method of producing the film in accordance with the present invention.

The structure of the second embodiment is explained first with reference to FIG. 4.

In FIG. 4, an anisotropic conductive film 11 comprises a film-like insulation member 12 made of, for example, an anodic oxidation film (Al₂O₃) mede from aluminium and a plurality of conductive members 13 buried in the insulation member 12 and each extending in the thickness direction of the film (vertically in the drawing). Numeral 14 designates a pore in which the member 13 is disposed. A plurality of pores 14 are formed in the member 12 according to a predetermined pattern. The member 13 is made from, for example, gold (Au). Each member 13 protrudes from the surface of the film member 12 in each of the upper and lower sides thereof. Therefore, the member 13 makes the film 11 conductive only in the direction of film thickness.

An example of the method for producing the film of FIG. 4 is explained below with reference to FIG. 5. The same or corresponding parts are designated by the same numerals as those of FIGS. 3a to 3d.

Figure 5A:
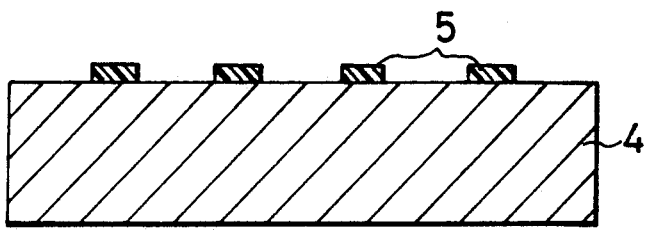
FIGS. 5a to 5f are sectional views of the anisotropic conductive film of FIG. 4 for explaining a flow of the process for producing the film and representing the film in different steps of the process in this order.

First, an entire surface of a conductive Al plate 4 is coated with a resist. The resist is then patterned to form a photoresist 5 of a predetermined pattern on the Al plate 4, as illustrated in FIG. 5a.

Figure 5B:
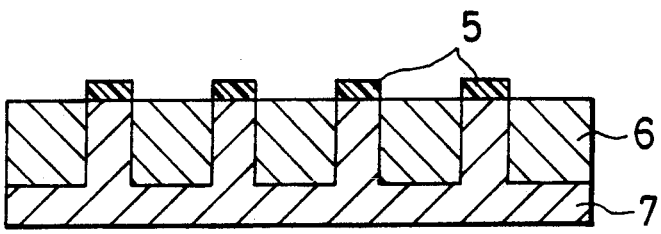

After that, an upper side of the plate 4 having the photoresist pattern 5 formed thereon is dipped in an acid solution so that an anodic oxidation film 6 and the Al substrate portion 7 are formed by the selective anodic oxidation process of the upper portion of the plate 4 using the plate 4 as the anode of the electrolysis process. This state is illustrated in FIG. 5b.

Figure 5C:
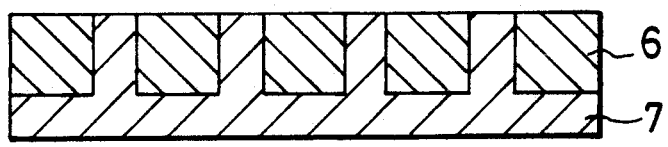
Figure 5D:
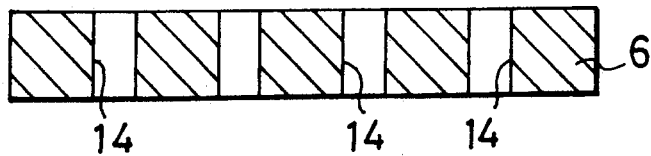

After that, as illustrated in FIGS. 5c and 5d, the photoresist 5 is removed and the substrate 7 is also removed by dissolving the portion so that a plurality of pores 14 are formed in the film 6 in a predetermined distribution pattern.

Figure 5E:
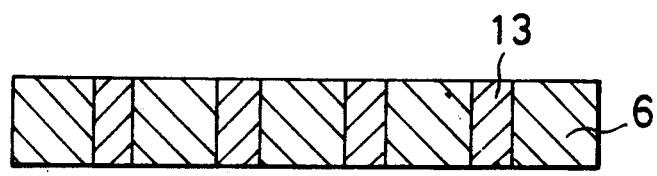

After that, as illustrated in FIG. 5e, the pores 14 are filled with a metal paste which is then baked and etched to form a conductive member 13 in each pore 14.

Figure 5F:
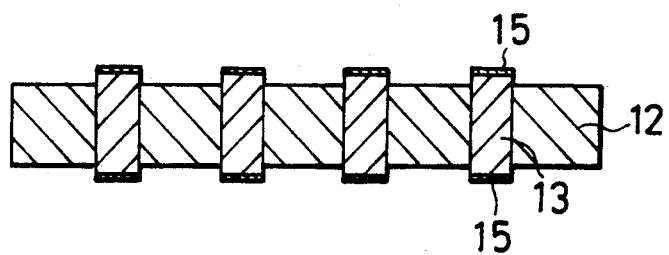

After that, 1 to 20 μm of the surface layer of the film 6 is dissolved and removed with the conductive member 13 being masked to form a film-like insulation member 12, as illustrated in FIG. 5f. A solder 15 may be disposed on each end surface of the member 13.

Due to the above mentioned arrangement of the second embodiment in which the anodic oxidation and the etching process are selectively conducted by masking the film and the predetermined pattern of conductive members are formed in a member 12 with the use of metal paste, it becomes possible to obtain the same effects and advantages as the first embodiment mentioned above.

Figure 6:
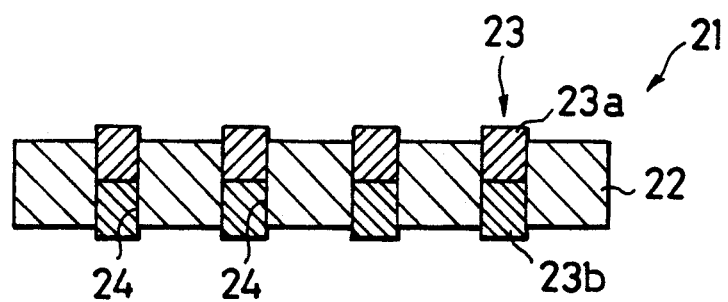
FIG. 6 is a sectional view of still another embodiment of the anisotropic conductive film in accordance with the present invention.

FIGS. 6 and 7 represent a third embodiment of the anisotropic conductive film and the method for producing the film in accordance with the present invention.

The structure of the third embodiment is described first with reference to FIG. 6.

In FIG. 6, an anisotropic conductive film 21 comprises a film-like insulation member 22 made from the anodic oxidation film mentioned above and a plurality of conductive members 23 buried in the insulation member 22 at predetermined positions. Each member 23 extends in the direction of the film thickness from the upper surface to the lower surface. The member 22 has a plurality of pores 24 in each of which the member 23 is beried. The member 23 is composed of an aluminum portion 23a and a gold portion 23b. The two portions 23a and 23b are electrically in contact with each other in the pore 24 and protrude from the upper and lower surfaces of the member 22, respectively so that the member 22 becomes conductive in the direction of film thickness.

An example of the method for producing the film of FIG. 6 is explained with reference to FIGS. 7a to 7e. The same or corresponding parts are designated by the same numerals as those of the embodiments mentioned above.

First, an entire surface of the conductive Al plate 4 is coated with a resist. The resist is patterned to form a predetermined photoresist pattern 5 on the plate 4, as illustrate in FIG. 7a.

Figure 7A:
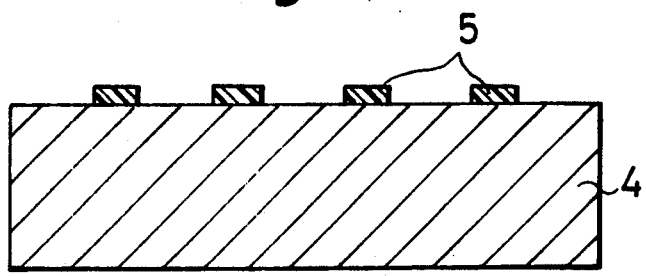
FIGS. 7a to 7e are sectional views of the anisotropic conductive film of FIG. 6 for explaining a flow of the process for producing the film and representing the film in different steps of the process in this order.
Figure 7B:
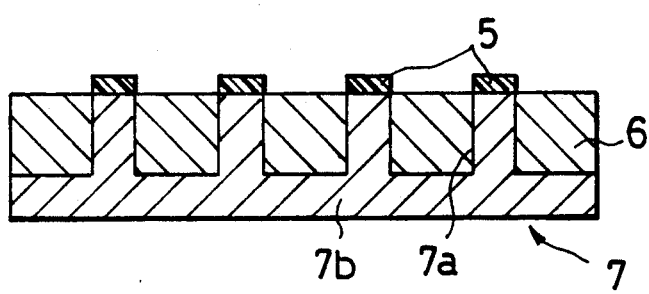

After that, as illustrated in FIG. 7b, the upper layer portion of the plate 4 having the resist pattern 5 formed thereon is dipped in an asid solution so that the anodic oxidation film 6 and the Al substrate 7 are formed by the selective anodic oxidation process of the upper portion of the plate 4 with the plate 4 being used as the anode of the electrolysis operation.

Figure 7C:
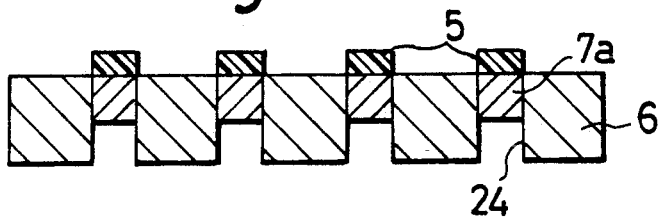

After that, as illustrated in FIG. 7c, the substrate 7 is dissolved and removed remaining a part of the stud portion 7a in each of the pores 24 to constitute the aluminium portion 23a, whereby a plurality of pores 24 having a predetermined depth are formed in the film 6.

Figure 7D:
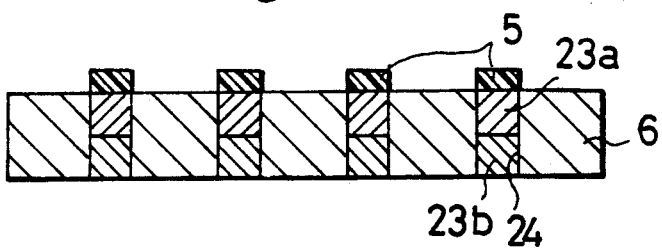
Figure 7E:
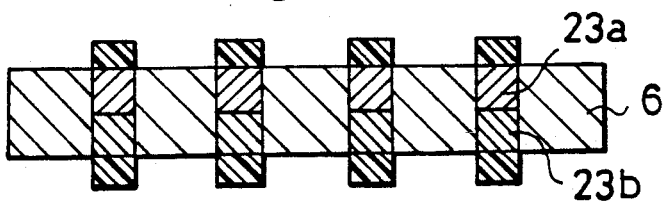

After that, as illustrated in FIG. 7d, the pores 24 are filled with, for example, gold paste which is then baked and etched to form the gold portion 23b in each pore 24.

After that, as illustrated in FIG. 7e, 1 to 20 $\mu$m thick of the film 6 is dissolved and removed with the members 23 being masked so as to form the insulation member 22 (FIG. 6) constituting the film 21.

In accordance with the third embodiment mentioned above, substantially the same advantages can be obtained as the embodiments mentioned before. Besides, due to the arrangement wherein each of the members 23 is divided to two portions made from different kinds of conductive material, it becomes possible to raise the applicability of the film and the functional reliability thereof by selectively disposing either portion of the conductive member 23 to match with the electrode or terminal to be connected.

FIGS. 8 to 17 represent a fourth embodiment of the anisotropic conductive film and a first to sixth example of the method for producing the film of the fourth embodiment in accordance with the present invention.

Figure 9A:
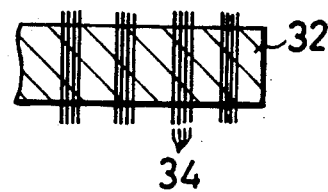
FIGS. 9a to 9c are explanatory views of different examples of conductive member arrangement.
Figure 9B:
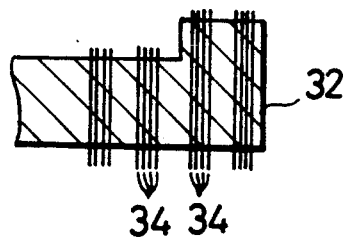
Figure 9C:
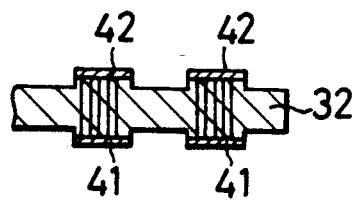
Figure 10:
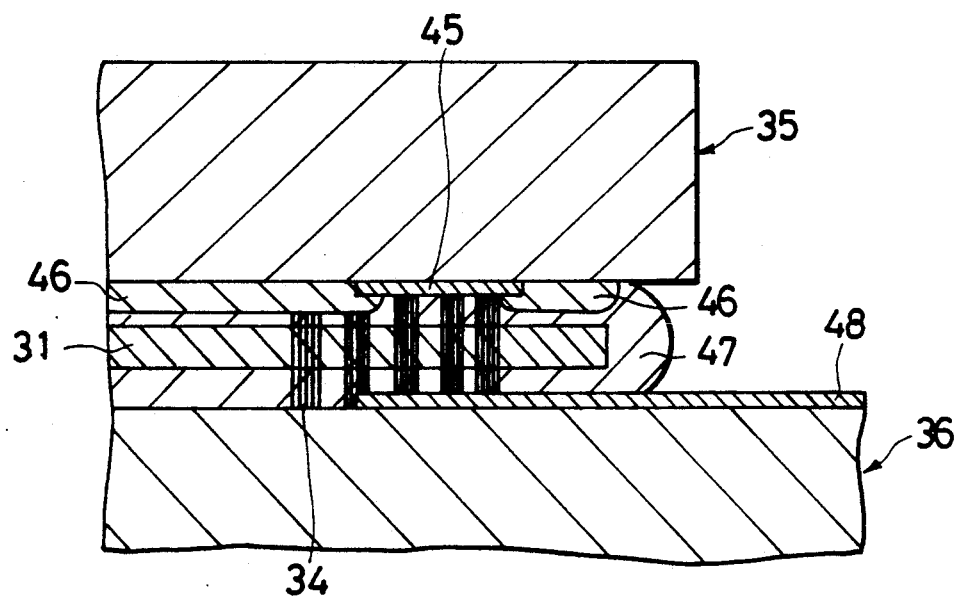
FIG. 10 is an explanatory views of a state of mounting an LSI chip on a substrate with the use of the anisotropic conductive film in accordance with the present invention.

The structure of the fourth embodiment is described first with reference to FIGS. 8 to 10.

Figure 8A:
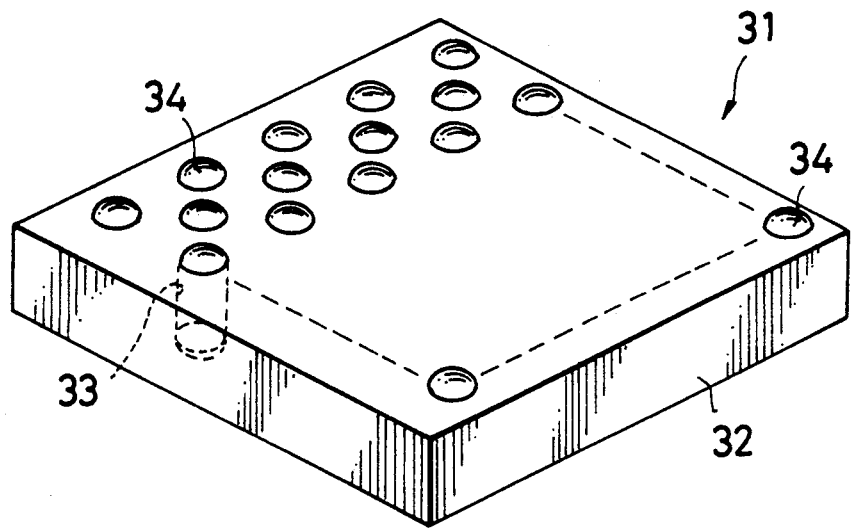
FIG. 8a is a perspective view of a further embodiment the anisotropic conductive film in accordance with the present invention.
Figure 8B:
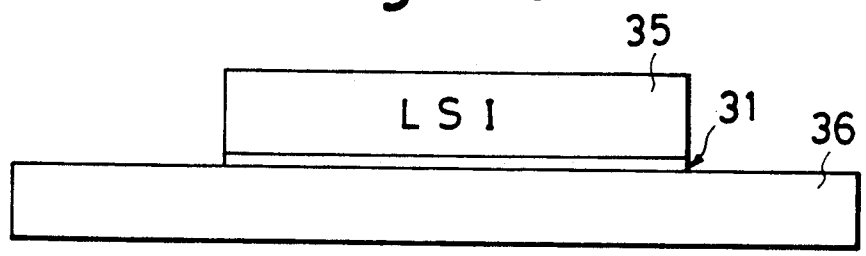
Figure 8C:
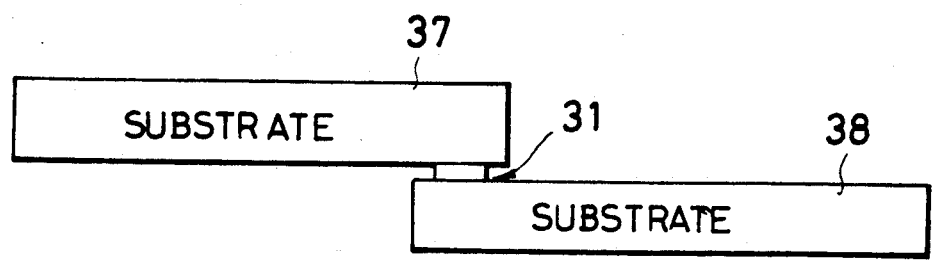

In FIGS. 8a to 8c, numeral 31 designates an anisotropic conductive film, numeral 32 designates a film-like insulation member made from Al$_2$O$_3$, for example, numeral 33 designates a pore formed in the member 32 extending in the direction of film thickness, that is, in the direction perpendicular to the film surface. A plurality of the pores 33 are formed in te member 32. Numeral 34 designates a conductive member mede from conductive metal such as gold. Numeral 35 designates a semiconductor chip such as an LSI chip. Numeral 36 designates a substrate on which the LSI chip 35 is to be mounted. Each of numerals 37 and 38 designates a printed wiring board having a wiring pattern (not shown) formed on the surface thereof.

The conductive members 34 are disposed in selected pores 33 or in all of the pores 33 which are formed from minute pores 53 described later. At least a part of the member 34 protrudes from the surface of the insulation member 32.

As illustrated in FIG. 8b or 8c, the film 31 is disposed between the LSI chip 35 and the substrate 36 (FIG. 8b) or between the printed wiring boards 37 and 38 so that the members 34 of the film 31 electrically interconnect the electrode pad of the chip 35 and the terminal of the substrate 36 or the wiring patterns of the boards 37 and 38.

FIG. 9a illustrates an example of the arrangement of the member 32. In this arrangement, the members 34 are selectively buried in the member 32 according to a predetermined pattern.

FIG. 9b illustrates another example of the arrangement of the member 32. In this arrangement, the member 32 is thickened at the portion where the pad or terminal of the chip or board to be connected is disposed.

FIG. 9c illustrates still another example of the arrangement of the member 32. In this arrangement, a plurality of electrodes 41 and 42 are formed on the upper and lower surfaces of the member 32. A plurality of conductive members 34 are connected to each electrode 41, 42.

FIG. 10 illustrates a state of connecting the LSI chip 35 with the substrate 36. In the drawings, numeral 45 designates an electrode pad (Al pad) of the LSI chip 35 and numeral 46 designates a passivating film of the chip 35. Numeral 47 designates an adhesive resin of thermosetting type or UV-setting type for bonding the chip 35 and the substrate 36 together with the film 31 interposed therebetween. Numeral 48 designates an aluminium wiring pattern formed on the substrate 36.

Examples of the method for producing the above mentioned film in accordance with the present invention are described below.

FIGS. 11a to 11e represent a first example of the method for producing the anisotropic cinductive film of the above mentioned fourth embodiment of the present invention.

Figure 11A:
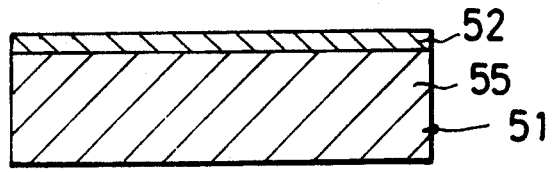
FIGS. 11a to 11e are explanatory views for explaining an embodiment of the flow of the process for producing the anisotropic conductive film in accordance with the present invention.

First, as illustrated in FIG. 11a, an upper layer 52 of a conductive substrate 51 is oxidized by anodic oxidation in an aqueous solution with the substrate 51 of aluminium being used as the anode of the electrolysis process.

Figure 11B:
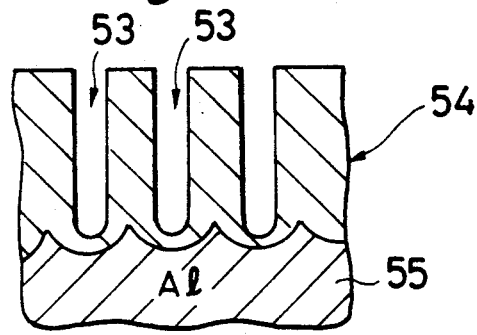

As illustrated in FIG. 11b, by the anodic oxidation process, an anodic oxidation film 54 having a plurality of minute pores 53 of about 0.01 to 0.2 $\mu$m diameter and a predetermined depth is formed on the Al substrate 55. The film 54 is about 1 to 100 $\mu$m thick. The film 54 comprises a plurality of cells in each of which a pore 53 is formed.

The conditions of the anodic oxidation process mentioned above are as follows.

The electrolytic solution is a phosphoric acid solution of 2 to 10%. The temperature is between 20° and 30° C. and the temperature change is within ±2° C. The applied voltage is 20 to 160 V for 30 to 120 min. The current density is 0.5 to 3 A/dm$^2$.

By such an anodic oxidation process, a number of minute pores 53 of less than 0.2 $\mu$m diameter are formed in the film 54 at a pitch of 0.3 to 0.4 $\mu$m, each pore 53 extending in the direction of film thickness, that is, perpendicular to the film surface.

It is to be noted that a sulfuric acid solution of about 5 to 20% may be used instead of the phosphoric acid solution. In this case, the temperature is between 10° and 25° C. and the temperature change is within ±1° C. The applied voltage is 10 to 40 V for 10 to 120 min. And the current density is 0.5 to 3 A/dm$^2$.

On the above mentioned conditions of the anodic oxidation process, it is also possible to form a number of minute pores 53 of less than 0.03 μm (10 to 30 nm) in the film 54 at a pitch of less than 0.1 μm (30 to 100 nm) in the direction of film thickness.

It is to be noted that using the phosphoric acid solution is advantageous in that, since pores of relatively large diameter are formed, it becomes easy to dispose the conductive member in each pore of the film 54 which is used as the insulation film as described later.

On the other hand, using the sulfuric acid solution is advantageous in that, since the film in this case becomes transparent, it becomes easy to achieve the positioning operation of the connecting portions. In this case, large diameter pores or conductive members penetrating the film 54 may be additionally formed in the film 54 by a photolithographic process or other appropriate processes.

Figure 11C:
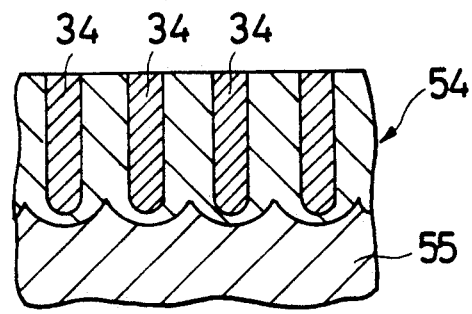

After that, as illustrated in FIG. 11c, an electrolytic deposition process is carried out using the lower substrate 51 as an electrode on the conditions that the solution temperature is 50° to 70° C., the current density is 0.1 to 20 A/dm$^2$ and electrolytic time is 10 to 120 min. By such an electrolytic deposition, gold for instance is deposited in the pores 53 of the film 54 to constitute the conductive members 34 in the pores.

It is to be noted that the members 34 may be formed by filling the pores 53 with metal paste or conductive macromolecule material. Also, the members 34 may be deposited by an electroless plating process or a dry plating process such as vacuum evaporation, sputtering or CVD.

Figure 11D:
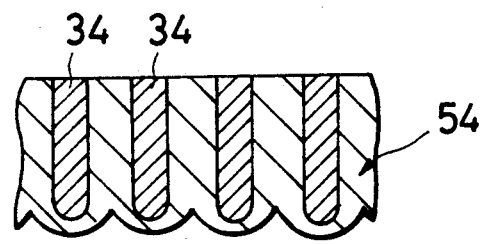

After that, as illustrated in FIG. 11d, the lower substrate 55 is dissolved and removed from the film 54 by bromine-methanol solution or phosphoric acid solution.

Figure 11E:
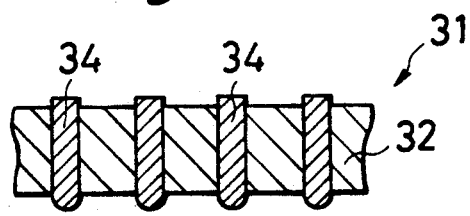

After that, as illustrated in FIG. 11e, the upper and lower surface layers of the film 54 are dissolved and removed by a hydrochloric acid group solution or a phosphoric acid group solution so as to form the film-like insulation member 32 having the conductive members 34 buried therein in the state that both ends of each member 34 protrude from the member 32 whereby the anisotropic conductive film 31 is obtained.

As mentioned above, in accordance with the method for producing the anisotropic conductive film of the present invention, it becomes possible to form the conductive members 34 in the very minute pores of less than 0.2 μm diameter disposed at a minute pitch of less than 0.4 μm in the film 32 without occurrence of short circuit in such a way that a conductive metallic material is oxidized by anodic oxidation to form an anodic oxidation film which is used as the porous insulation film 32. An end of each conductive member 34 is hemispherical.

Also, as mentioned before, the insulation member 32 of the present invention is much more heat-resistant and humidity-resistant in comparison to the prior art resin insulation film. Therefore, it becomes possible to prevent the conductive members from moving at the time of connecting operation, which increases the reliability of electrical connection.

Besides, in accordance with this embodiment of the present invention, since the conductive members 54 are formed in the pores 53 by electrolytic deposition, it becomes easy to reliably form the conductive members in the pores, which also raises the reliability of electrical connecting function of the film.

FIGS. 12a to 12e represent a second example of the method for producing the film of FIGS. 8 to 10 in accordance with the present invention.

Figure 12A:
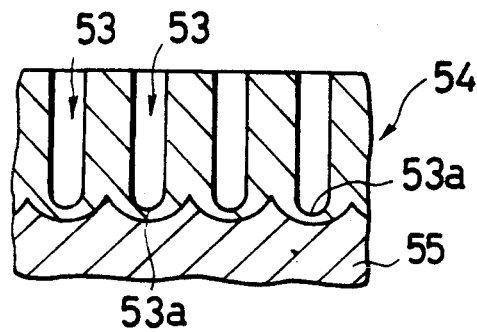
FIGS. 12a to 12e are explanatory views for explaining another embodiment of the flow of the process for producing the anisotropic conductive film in accordance with the present invention.

In this embodiment, first, an upper layer 52 of the conductive substrate 51 is oxidized by anodic oxidation with the substrate 51 being used as the anode in the aqueous solution of the electrolysis process. By the anodic oxidation process, the anodic oxidation film 54 is formed to 1 to 100 μm thick on the upper side of the substrate 51, as illustrated in FIG. 12a. The film 54 has a plurality of minute pores 53 of predetermined depth formed therein. The anodic oxidation process is conducted substantially under the same conditions as the first example of the producing method of the film mentioned before.

After that, in accordance with the current restoration method, the applied voltage is lowered in the anodic oxidation solution to the extent that the voltage becomes 2 V finally. Then, the counter electrode is replaced by plutinum or carbon which is not oxidized by the anodic oxidation process. The solution temperature is maintained at a low temperature. The substrate 51 is connected to the cathode and the current is increased gradually from 5 mA/cm$^2$ to 10 mA/cm$^2$. In the above mentioned process, hydrogen gas is generated and due to the pressure of the gas the film 54 is disengaged from the lower layer 55 of the substrate 51 so that the film 54 can be separated from the lower substrate 55.

It is to be noted that in the above mentioned process, the bottom portion 53a of each pore 53 is removed so that the pore 53 penetrates through the film 54.

Figure 12B:
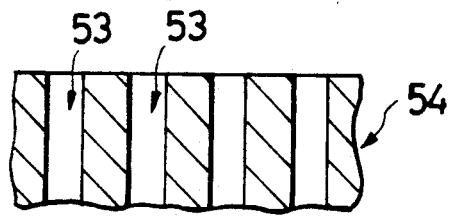

After that, as illustrated in FIG. 12b, the film 54 is taken from the electrolytic solution, whereby the film 54 is completely separated from the substrate 55. After that, if necessary, the pores 53 may be enlarged by partly dissolving the film 54 by the phosphoric acid solution or the like.

Figure 12C:
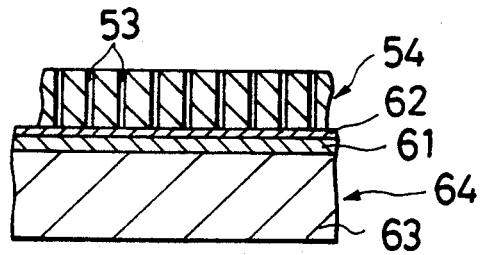

After that, as illustrated in FIG. 12c, under the film 54 is disposed a master 64 which is composed of a nickel layer 61, a separation layer 62 made from an anodic oxidation film and an insulation substrate 63. The layers 61 and 62 are stacked on the substrate 63.

With such an arrangement, an electrolytic deposition process is carried out with the nickel layer 61 being used as an electrode on the conditions that the solution temperature is between 50° and 70° C., the current density is 0.1 to 20 A/dm$^2$ and the electrolytic time is 10 to 120 min.

By the electrolytic deposition process, a conductive matal such as gold (Au) is deposited in the pores 53 of the film 54 to constitute the conductive members 34.

Figure 12D:
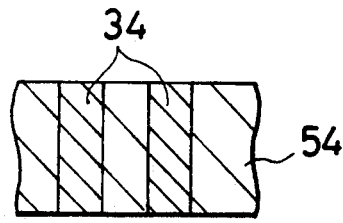

After that, as illustrated in FIG. 12d, the film 54 is separated from the layer 62 of the master 64.

Figure 12E:
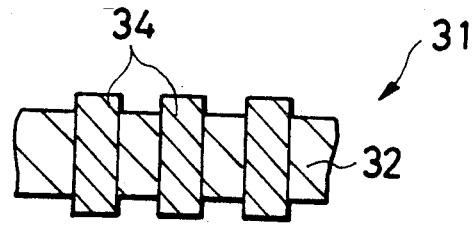

After that, as illustrated in FIG. 12e, the upper and lower surface layers of the film 54 are dissolved by hydrochloric acid group solution to form a film-like insulation member 32 having conductive members 34 buried therein each protruding from the upper and lower surfaces of the member 32 to constitute the anisotropic conductive film 31.

The structure and effect of the film 31 produced by the method of FIGS. 12 are substantially the same as those of the method of FIGS. 11 except that the both ends of each member 34 are of the same shape.

FIGS. 13 and 14 represent a third example of the method for producing the film of FIGS. 8 to 10 in accordance with the present invention.

In this example, first, the anodic oxidation film 54 is formed by an anodic oxidation process in a sulfuric acid solution of 10 to 20% on the conditions that the current density is 1 to 3 A/dm$^2$, the solution temperature is 15° to 25° C. ±1° C. and the electrolysis time is 10 to 120 min. The film 54 is then separated from the lower layer 55 of the substrate 1.

Figure 13A:
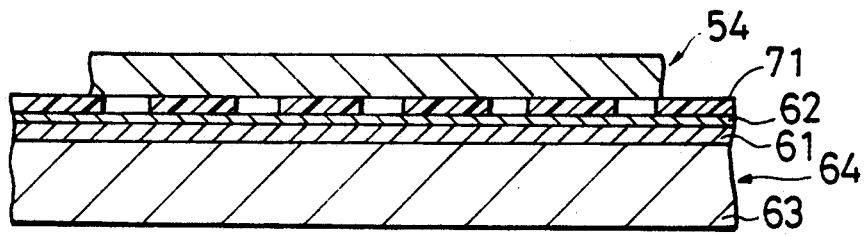
FIGS. 13a to 13c are explanatory views for explaining still another embodiment of the flow of the process for producing the anisotropic conductive film in accordance with the present invention.

After that, as illustrated in FIG. 13a, under the separated film 54 having pores 53 formed therein penetrating therethrough, a master 64 is disposed for forming the conductive portion in the pores of the film 54. The master 64 has a mask pattern 71 made from SiO$_2$ or photosensitive resin prestacked thereon.

With that arrangement, an electrolytic deposition process is carried out with the nickel layer 62 being selectively used as the electrode under the conditions that the solution temperature is 25° to 40° C., the current density is 0.2 to 3 A/dm$^2$ and the electrolysis process time is 10 to 120 min.

Figure 13B:
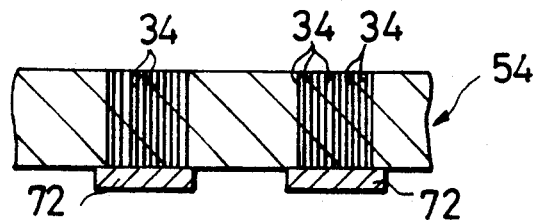

By the electrolytic deposition, as illustrated in FIG. 13b, a conductive metal such as nickel (Ni) is selectively deposited in a predetermined pores 53 of the film 54 to constitute the conductive members 34.

It is to be noted that in the above mentioned process, a protruding electrode 72 is formed between each adjacent two mask patterns 71. A plurality of members 34 are connected to the electrode 72.

Figure 14A:
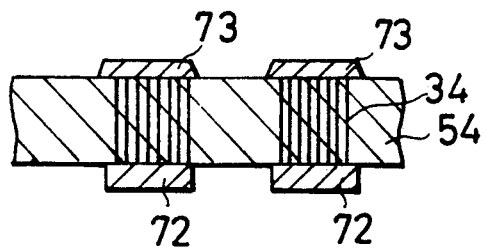
FIGS. 14a and 14b are explanatory views for explaining a further embodiment of the flow of the process for producing the anisotropic conductive film in accordance with the present invention.

Also, by elongating the electrolytic deposition time, as illustrated in FIG. 14a, it becomes possible to form electrodes 73 on the upper side of the film 54 in addition to the lower electrodes 72 so that the members 34 are completely covered by the electrodes 72 and 73 and connected with each other on the outside surface of the film 54.

Figure 13C:
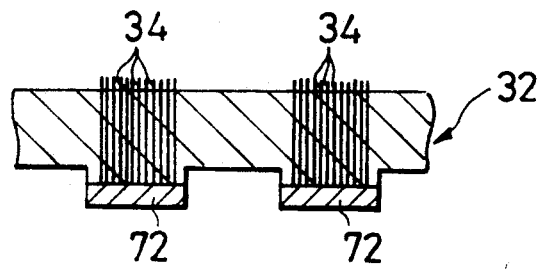

After that, as illustrated in FIG. 13c, the upper and lower surfaces of the film 54 are dissolved and removed by a hydrochloric acid group solution to form a film-like insulation member 32 having conductive members 34 buried therein each protruding an end thereof from the upper surface of the film 54, thus constituting an anisotropic conductive film 31 of the present invention.

Figure 14B:
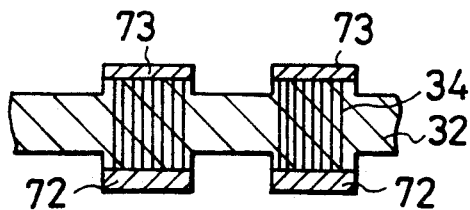

It is to be noted that, by further dissolving and removing the surface layer of the film 54, it becomes possible to further protrude the electrodes 72 and 73, as illustrated in FIG. 14b.

As mentioned above, in accordance with the third example of the method for producing the film 31 of the present invention, due to the featured arrangement of the electrodes, it becomes possible to selectively form the conductive members 34 in a desired pattern. Therefore, it becomes possible to form the pattern of the members 34 corresponding exactly to the pattern to be connected, which enables to save the material for the conductive members and reduce the cost of the film.

Also, it becomes possible to constitute the member 34 from a bundle of very thin conductive lines, which reduces the unnecessary force applied to the connecting portions of the chip 35 or printed wiring boards 37, 38 in the connecting state as illustrated in FIGS. 8b and 8c, whereby a stable electric connection can be achieved.

Further, it becomes possible to easily form the protruding electrodes 72 and 73 connecting to the bundle of members 34 only by controlling the electrolytic deposition time.

FIGS. 15 represent a fourth example of the method for producing the film 31 of FIGS. 8 in accordance with the present invention.

In this example, first, an anodic oxidation film 54 is formed in the same way as the example of FIGS. 12a and 12b and the film 54 is separated from the lower layer 55 of the substrate 51.

Figure 15A:
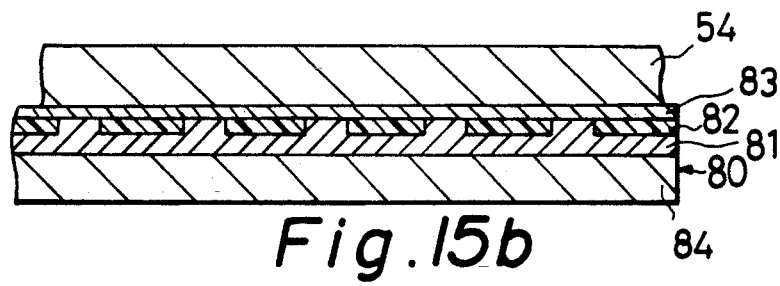
FIGS. 15a to 15c are explanatory views for explaining a still further embodiment of the flow of the process for producing the anisotropic conductive film in accordance with the present invention.

After that, as illustrated in FIG. 15a, under the film 54 having pores 53 formed therein penetrating therethrough, a master 80 is disposed for forming the conductive members in the pores of the film. The master 80 comprises an insulation substrate 84, an electrode layer 81 having recess portions formed by etching the conductive metallic film deposited on the substrate 84, a plurality of masks 82 disposed in the recesses of the layer 81 to flatten the layer surface, and a separation layer 83 which is treated by dichromic acid or includes organic substance such as albumen and deposited on the layer 81.

Figure 15B:

After that, an electrolytic deposition process is carried out with the nickel layer 82 being used as an electrode under the condition that the solution temperature is 50° to 70° C., the current density is 0.1 to 20 A/dm$^2$, and the deposition time is 10 to 120 min. By this electrolytic deposition process, as illustrated in FIG. 15b, conductive metal such as gold (Au) is deposited in the pores 53 of the film 54 to constitute the conductive members 34 buried in the film 54.

Figure 15C:
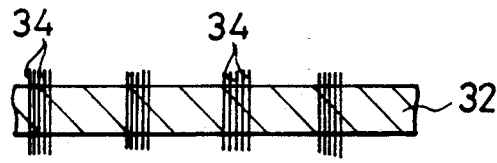

After that, as illustrated in FIG. 15c, the upper and lower surface layers of the film 54 are dissolved and removed by an hydrochloric acid group solution to form a film-like insulation member 32 having conductive members 34 buried therein each protruding both ends from the upper and lower surfaces of the film 54 constituting the anisotropic conductive film 31 of the present invention.

As mentioned above, in accordance with the fourth example of the film producing method of the present invention, by using the master 80 which has a flat surface on which the electrode is to be formed, it becomes also possible to obtain the similar advantages as the examples mentioned before.

Also, the conductive portion of the film 54 may be composed of only bundles of members 34 each protruding from the upper and lower surfaces of the film 54 without forming the electrodes on the film surface connecting the members 34.

Figure 16A:
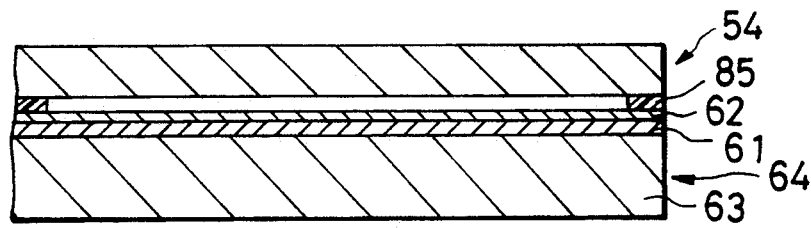
FIGS. 16a to 16c are explanatory views for explaining a still further embodiment of the flow of the process for producing the anisotropic conductive film in accordance with the present invention.
Figure 16B:
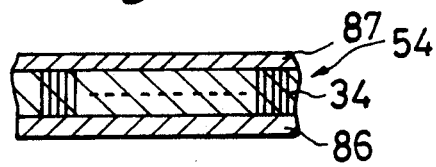
Figure 16C:
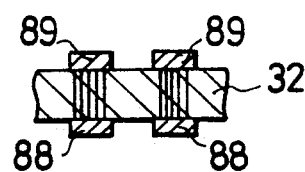

FIGS. 16a to 16c represent a fifth example of the method for producing the film 31 of FIGS. 8 to 10 in accordance with the present invention.

In this example, first, an anodic oxidation film 54 is formed in the same way as the example of FIGS. 12a and 12b. The film 54 is separated from the lower layer 55 of the conductive substrate 51.

After that, as illustrated in FIG. 16a, a master 64 having steps 85 protruding therefrom is disposed under the film 54 having pores 53 formed therein penetrating therethrough.

After that, as illustrated in FIG. 16b, the conductive members 34 are formed by deposition gold in the pores 53 of the film 54 by an electrolytic deposition process with the nickel layer 62 being used as the electrode under the conditions that the solution temperature is 50° to 70° C., and the current density is 0.1 to 20 A/dm$^2$. The electrolytic deposition process is further continued until the upper and lower surfaces of the film 54 are covered by gold layers 86 and 87, respectively.

After that, as illustrated in FIG. 16c, the gold layers 86 and 87 are patterned by partly removing the layers by a photoetching process or a laser irradiation process to form protruding electrodes 88 and 89 connecting the conductive members 34 on the upper and lower surfaces of the film 54, respectively, to constitute the anisotropic conductive film 31 of the present invention.

The electrodes may be formed only on one side surface of the film 54 to connect one end of the bundle of the members 34 while the other end of the bundle is protruded by dissolving the surface layer of the film 54.

As mentioned above, in accordance with the fifth example of the film producing method of the present invention, it becomes possible to form a desired pattern of protruding electrodes or wirings by patterning the matallic layers 86 and 87 by photoetching or laser.

FIGS. 17a to 17f represent a sixth example of the method for producing the film 31 of FIGS. 8 to 10 in accordance with the present invention.

In this example, first, as the first example mentioned before, the upper portion 52 of the conductive substrate 51 is oxidized by the anodic oxidation process with the substrate 51 being used as the anode in the aqueous solution of the electrolysis process to form the anodic oxidation film 54 of 1 to 100 μm thick and having a plurality of minute pores 53 of a predetermined depth formed in the film.

Figure 17A:
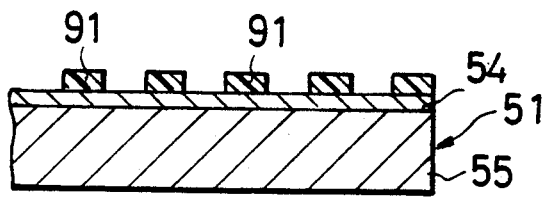
FIGS. 17a to 17f are explanatory views for explaining a still further embodiment of the flow of the process for producing the anisotropic conductive film in accordance with the present invention.
Figure 17B:
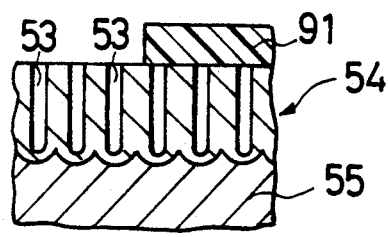

After that, as illustrated in FIGS. 17a and 17b, a predetermined pattern of mask 91 is formed on the film 54 by coating the film surface with a photosensitive resin and after that exposing and developing the photosensitive resin.

Figure 17C:
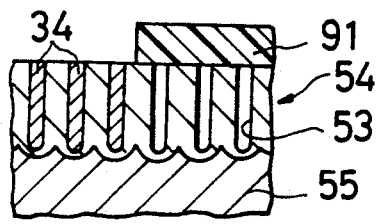

After that, as illustrated in FIG. 17c, a conductive metal such as gold (Au) is deposited in the unmasked pores 53 of the film 54 by an electrolytic deposition process with the lower layer 55 of the substrate 51 being used as an electrode under the condidtions that solution temperature is 50° to 70° C., the current density is 0. 1 to 20 A/dm$^2$, and the electrolysis time is 10 to 120 min. to form the conductive members 34 in the pores. That is, the members 34 are selectively formed in a predetermined pattern of pores 53 by masking the film 54 with the mask 91.

After that, in accordance with the current restoration method, the applied voltage is lowered in the anodic oxidation solution to the extent that the voltage becomes 2 V finally. Then, the counter electrode is replaced by plutinum or carbon which is not oxidized by the anodic oxidation process. The solution temperature is maintained at a low temperature. The substrate 51 is connected to the cathode and the current is increased gradually from 5 mA/cm$^2$ to 10 mA/cm$^2$. In the above mentioned process, hydrogen gas is generated and due to the pressure of the gas the film 54 is disengaged from the lower layer 55 of the substrate 51 so that the film 54 can be separated from the lower substrate 55.

Figure 17D:
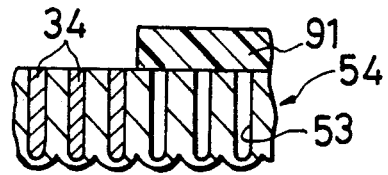

After that, as illustrated in FIG. 17d, the film 54 is taken from the electrolytic solution, whereby the film 54 is completely separated from the lower substrate 55.

Figure 17E:
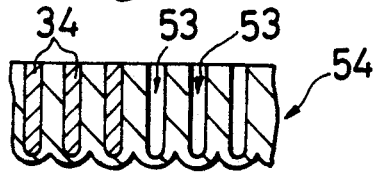

After that, as illustrated in FIG. 17e, the mask 91 is removed from the film 54.

Figure 17F:
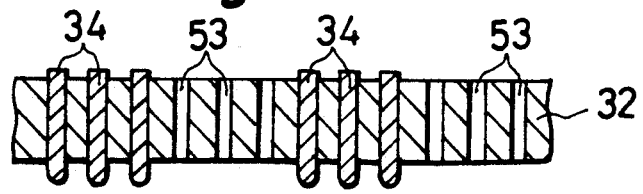

After that, as illustrated in FIG. 17f, the upper and lower surfaces of the film 54 are dissolved and removed by a hydrochloric acid group solution to form the film-like insultion member 32 having the conductive members 34 buried therein each protruding from both of the upper and lower surfaces of the film 54 to constitute the anisotropic conductive film 31 of the present invention.

As mentioned above, in accordance with the sixth example of the film producing method of the present invention, the conductive members 34 are selectively formed by partly masking the pores 53 of the film 54, whereby the advantages mentioned before can also be obtained as the preceding examples.

Many widely different embodiments of the present invention may be constructed without departing from the spirit and scope of the present invention. It should be understood that the present invention is not limited to the specific embodiments described in the specification, except as defined in the appended claims.

What is claimed is:

1. An anisotropic conductive film comprising:
   an electrically insulating film member having an upper surface and a lower surface; and
   a plurality of conductive members, each of said plurality of conductive members being buried in said film member and protruding from both of said upper surface and said lower surface.

2. An anisotropic conductive film according to claim 1, wherein said insulating film member is an anodic oxidation film made by oxidizing a conductive material by an anodic oxidation process.

3. An anisotropic conductive film according to claim 2, wherein said conductive member has a longitudinal stud shape and extends in a film thickness direction substantially perpendicular to said film surface spanning between said upper and lower surfaces.

4. An anisotropic conductive film according to claim 3, wherein said anodic oxidation film has a plurality of minute pores formed therein extending in said film thickness direction, said conductive members being disposed in said pores.

5. An anisotropic conductive film according to claim 1, wherein said conductive member includes a solder layer disposed at each end thereof, said solder layer protruding from said film surface.

6. An anisotropic conductive film according to claim 1, wherein said conductive member comprises two different conductive materials respectively protruding from opposite film surfaces.

7. An anisotropic conductive film according to claim 1, wherein said conductive members are disposed in accordance with a predetermined pattern arrangement.

8. An anisotropic conductive film according to claim 1, wherein said insulating film has a thickened portion in which said conductive members are buried.

9. An anisotropic conductive film according to claim 7, wherein said pattern includes a plurality of bundles of conductive members, at least one end of each bundle is covered by an electrode formed on said film surface protruding therefrom.

10. An anisotropic conductive film according to claim 1, wherein said film being disposed between a semiconductor chip and a substrate with an adhesive agent to electrically connect said semiconductor chip and said substrate.

11. An anisotropic conductive film comprising:
   an electrically insulating film member made by oxidizing a conductive material by an anodic oxidation process and having an upper surface and a lower surface;
   a plurality of conductive members, each of said plurality of conductive members being buried in said insulating film member extending in a film thickness direction from said upper surface to said lower surface; and
   an electrode pattern formed on at least one of said upper and lower surfaces of said insulating film disposed to cover an end of said conductive member.

12. An anisotropic conductive film comprising:
   an anodic oxidation film made by oxidizing a conductive material by an anodic oxidation process, said anodic oxidation film having a plurality of minute pores formed in a honeycomb pattern therein and each extending in a thickness direction of said film; and
   a plurality of conductive members disposed respectively in said pores according to a predetermined pattern arrangement, and said conductive members each having protruding portions protruding in a direction substantially perpendicular to upper and lower surfaces of said film.

13. An anisotropic conductive film according to claim 12, wherein each of said conductive members has a longitudinal stud shape.

14. An anisotropic conductive film according to claim 12, wherein each of said conductive members comprises a solder layer disposed at each protruding end thereof.

15. An anisotropic conductive film according to claim 12, wherein each of said conductive members is comprised of two different conductive materials, which protrude respectively from said surfaces in opposite directions to each other.

16. An anisotropic conductive film according to claim 12, wherein said film has a thickened portion, and said conductive members are disposed in said thickened portion of said film.

17. An anisotropic conductive film according to claim 12, wherein said conductive members of said film electrically connect a semiconductor chip and a substrate.

18. An anisotropic conductive film according to claim 12, wherein a diameter of each of said pores is less than 0.2 μm and a pitch between said pores is between 0.3 μm and 0.4 μm.

19. An anisotropic conductive film according to claim 12, wherein a diameter of each of said pores is less than 0.03 μm and a pitch between said pores is less than 0.1 μm.

20. An anisotropic conductive film comprising:
   an anodic oxidation film made by oxidizing a conductive material by an anodic oxidation process, said anodic oxidation film having a plurality of minute pores formed in a honeycomb pattern therein and each extending in a thickness direction of said film; and
   a plurality of conductive members disposed respectively in said pores so as to form a plurality of bundles, and said conductive members each having protruding portions protruding from an upper surface and a lower surface in such a manner that said protruding portions of said conductive members of each of said bundles provide a connection point at which said conducting members may be connected without applying pressure to said anisotropic conductive film.

21. An anisotropic conductive film according to claim 20, wherein at least one end of each of said plurality of bundles is covered by an electrode.

* * * * *